United States Patent
Wang et al.

(10) Patent No.: US 11,377,729 B2
(45) Date of Patent: Jul. 5, 2022

(54) POST-PROCESSING METHOD FOR IMPROVING ANTI-WEAR AND FRICTION-REDUCING PROPERTIES OF CrN COATING

(71) Applicant: NINGBO INSTITUTE OF MATERIALS TECHNOLOGY & ENGINEERING, CHINESE ACADEMY OF SCIENCES, Zhejiang (CN)

(72) Inventors: Yongxin Wang, Zhejiang (CN); Zechao Li, Zhejiang (CN); Jingwen Zhang, Zhejiang (CN); Zhixiang Zeng, Zhejiang (CN); Jinlong Li, Zhejiang (CN); Xia Lu, Zhejiang (CN); Liping Wang, Zhejiang (CN)

(73) Assignee: NINGBO INSTITUTE OF MATERIALS TECHNOLOGY & ENGINEERING, CHINESE ACADEMY OF SCIENCES, Ningbo (CN)

( * ) Notice: Subject to any disclaimer, the term of this patent is extended or adjusted under 35 U.S.C. 154(b) by 20 days.

(21) Appl. No.: 16/956,080

(22) PCT Filed: Dec. 20, 2018

(86) PCT No.: PCT/CN2018/122389
§ 371 (c)(1),
(2) Date: Jun. 19, 2020

(87) PCT Pub. No.: WO2019/120253
PCT Pub. Date: Jun. 27, 2019

(65) Prior Publication Data
US 2020/0318232 A1    Oct. 8, 2020

(30) Foreign Application Priority Data
Dec. 21, 2017    (CN) .......................... 201711397143.0

(51) Int. Cl.
C23C 14/58 (2006.01)
C23C 14/06 (2006.01)
C23C 14/32 (2006.01)

(52) U.S. Cl.
CPC ...... *C23C 14/5806* (2013.01); *C23C 14/0641* (2013.01); *C23C 14/32* (2013.01)

(58) Field of Classification Search
CPC .. C23C 14/5806; C23C 14/0641; C23C 14/32
See application file for complete search history.

(56) References Cited

U.S. PATENT DOCUMENTS

| 5,766,693 A | 6/1998 | Rao |
| 2006/0049035 A1 | 3/2006 | Hosenfeldt et al. |
| 2015/0337429 A1* | 11/2015 | Wirtjes .................. C23F 17/00 148/210 |

FOREIGN PATENT DOCUMENTS

| CN | 101314854 A | 12/2008 |
| CN | 101691653 A | 4/2010 |

(Continued)

OTHER PUBLICATIONS

Durmaz et al. Tribological Properties of CrN Coatings Deposited by Nitro-Chromizing Treatment on AISI D2 Steel, APMAS 2014 conference proceedings, AIP Conf. Proc. 1653, 020034-1-002034-8. (Year: 2014).*

(Continued)

*Primary Examiner* — Kelly M Gambetta
(74) *Attorney, Agent, or Firm* — Mintz Levin Cohn Ferris Glovsky and Popeo PC

(57) ABSTRACT

Disclosed is a post-processing method for improving anti-wear and friction-reducing properties of a CrN coating. According to the method, the CrN coating is subjected to a thermal cycling treatment in a temperature range of −20° C. to 60° C. under a humidity environment of 60%-80% R.H. The post-processing method can substantially improve the (Continued)

anti-wear and friction-reducing properties of the CrN coating, so that friction pair parts deposited with the coating achieve a stable operation for a long time.

8 Claims, 2 Drawing Sheets

(56) References Cited

FOREIGN PATENT DOCUMENTS

| | | | |
|---|---|---|---|
| CN | 103256142 A | 8/2013 |
| CN | 203782221 A | 8/2014 |
| CN | 105506566 A | 4/2016 |
| JP | 5616082 B2 | 10/2014 |

OTHER PUBLICATIONS

English Translation of the International Search Report corresponding to pct/cn2018/122389 dated Feb. 13, 2019; 3 pages.

\* cited by examiner

POST-PROCESSING METHOD FOR IMPROVING ANTI-WEAR AND FRICTION-REDUCING PROPERTIES OF CRN COATING

TECHNICAL FIELD

The invention belongs to the technical field of surface engineering protection, and in particular relates to a post-processing method for low-temperature thermal cycle of a multi-arc ion plating CrN coating to improve the mechanical and tribological properties of the CrN coating.

BACKGROUND TECHNIQUE

There are high requirements for the hardness, strength and fatigue resistance of substrate of various types of mechanical parts. Whether the parts of equipment can work safely and stably for a long period of time depends largely on the surface directly subjected to friction, wear and media erosion. Changes in surface conditions such as plastic deformation, crack propagation, erosion, cavitation, oxidation, material removal, and the like will lead to a significant reduction in service life and safety of the parts. Even for totally failed parts, the failure process is also gradually extended from the surface subjected to external action to the core of the material. Under the working conditions of many mechanical equipment (such as drilling and mining, aerospace, gas power system, etc.), it is generally impossible to find a material that can meet the dual requirements of structural support and surface toughness. Therefore, research and development of surface protection and strengthening technology have great significance for improving the performance and quality of equipment, extending the service life of key parts, and reducing energy consumption. Moreover, the loss of materials due to friction and wear is increasing sharply. Only considering the function of providing surface protection, surface treatment has a basis for wide application. It is precisely because the technical connotation of surface treatment is in line with the advanced manufacturing concepts in the 21$^{st}$ century aiming at high quality, high efficiency, safety, reliability, energy saving and material saving, it can provide strong technical support for remanufacturing projects and contribute to the low-carbon circular economy. Surface treatment integrates new technologies of various disciplines such as machinery, electronics, and automatic control on the basis of physics and chemistry, and the research and practical values are continuously improved. As a typical representative of surface treatment, thin film technology is widely used in the field of material protection.

As a traditional PVD hard coating, CrN coating is widely used because of its high hardness, excellent wear resistance and excellent thermal stability. However, with the development of industry and the intensification of the service environment, the performance of CrN coatings has gradually failed to meet the requirements in extremely harsh environment, especially in harsh marine corrosive environment, the corrosion phenomena such as erosion, pitting and stress cracking caused by high humidity and sea salt particles are aggravated.

There is a need in the art to develop a post-processing method to improve the anti-wear and friction-reducing properties of CrN coatings to improve the mechanical and tribological properties of CrN coatings.

SUMMARY OF THE INVENTION

The purpose of the present invention is to provide a post-processing method for improving the anti-wear and friction-reducing properties of CrN coating.

In the first aspect of the present invention, it provides a post-processing method for a CrN coating, which comprises subjecting the CrN coating to a thermal cycle treatment in a temperature range of −20 to 60° C. under a humidity environment of 60% to 80% R.H.

If the humidity is too low, too little oxygen is adsorbed on the surface and inside of the coating, and Cr oxides generated during friction are insufficient, thus having an impact on friction reduction and wear resistance. If the humidity is too high, the corrosion behavior of the coating will be aggravated, thereby reducing the life of the CrN coating.

If the temperature range is expanded, the compressive internal stress generated during the heating and cooling stages of the coating is too large, so that it not only does not produce strain hardening, but also reduces the bonding between the coating and the substrate, thus reducing the hardness of the coating and reducing the anti-friction and anti-wear effect of the coating.

In another preferred embodiment, during the thermal cycle treatment, the heating rate during heating process is 2° C./min, and the temperature deviation is less than or equal to ±2° C.

In another preferred embodiment, during the thermal cycle treatment, the cooling rate during the cooling process is 1° C./min, and the temperature deviation is less than or equal to ±2° C.

In another preferred embodiment, the humidity has a deviation of less than or equal to ±2% R.H.

In another preferred embodiment, during the thermal cycle treatment, a single thermal cycle time is 2 h, every 6 cycles is one period, a constant temperature is maintained between every two periods for 12 h, and the constant temperature has a fluctuation of ±0.5° C.

In another preferred embodiment, the time of the thermal cycle treatment is 7 days.

In another preferred embodiment, the thickness of the CrN coating is 2 μm to 80 μm, and the thickness deviation is less than or equal to 0.5 μm.

In another preferred embodiment, the CrN coating is plated on a substrate by a multi-arc ion plating technique, and the substrate is a metal or an alloy.

In another preferred embodiment, the substrate is a 316L stainless steel substrate.

In another preferred embodiment, the CrN coating is plated on the substrate by multi-arc ion plating technology for 2-24 h, and then subjected to a thermal cycle treatment in a temperature range of −20 to 60° C., and the temperature deviation is less than or equal to ±2° C.

It should be understood that, within the scope of the present invention, each of the above technical features of the present invention and each of the technical features specifically described below (e.g., examples) can be combined with each other, thereby forming a new or preferred technical solution. Each feature disclosed in the specification can be replaced by any alternative feature that provides the same, equal or similar purpose. Due to space limitations, they will not be redundantly described herein.

DETAILED DESCRIPTION

Figure 1:
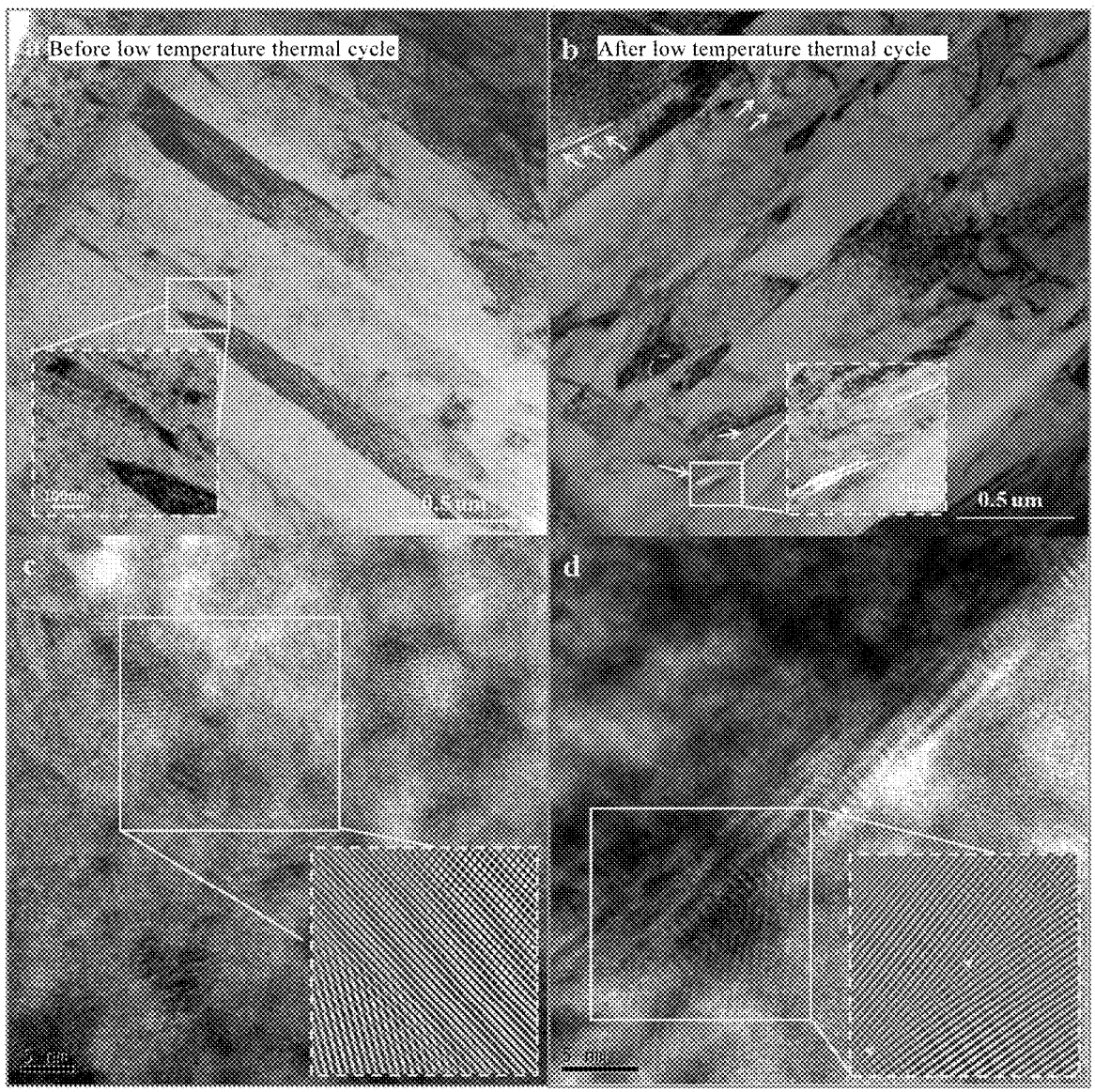
FIG. 1 is a high-resolution transmission electron microscope image and Fourier filter diagram of a CrN coating (with a thickness of 5.4 μm) before and after thermal cycle treatment in Example 1.

After extensive and intensive researches, the inventors of the present application have firstly developed a post-processing method for improving the anti-wear and friction-reducing properties of CrN coatings, which is a low-temperature thermal cycle treatment method for CrN coatings. The anti-wear and friction-reducing properties of the CrN coating can be greatly improved via said method, so that the friction pair parts deposited with the coating can achieve stable operation for a long time. On this basis, the present invention has been completed.

CrN Coating

The invention may adopt multi-arc ion plating technology to deposit Cr transition layer and CrN thin film layer in sequence on the surface of the substrate which is cleaned for 20 minutes.

The target material used is a metal Cr target (purity>99.5 wt %, diameter 63 mm), and the vacuum degree of the reaction chamber base is $3 \times 10^{-3}$ Pa to $6 \times 10^{-3}$ Pa. Firstly, the surface of the substrate is etched to remove the oxide layer and impurities under the deposition biases of −900 V, −1100 V and −1200 V, respectively. After Cr layer is deposited, the working atmosphere is Ar, the flow rate is 350-450 sccm, the working vacuum is 0.2-0.5 Pa; the deposition bias is adjustable from −15V to −25 V, the Cr target arc current is 55-65 A, the deposition temperature is maintained at 300 to 400° C., and the deposition time is 10 to 15 minutes. Finally, CrN layers are deposited for different times such as 1 h to 24 h, the working atmosphere is $N_2$, the flow rate is 550 to 650 sccm, the working vacuum degree is 0.2 to 0.5 Pa; the deposition bias is adjustable from −15 to −25 V, the Cr target arc current is 55-65 A, and the deposition temperature is kept at 300-400° C.

The substrate material is not limited, and may include metal and alloy thereof. The thickness of the CrN coating is 2 μm to 80 μm.

Thermal Cycle Treatment

In the present invention, the anti-wear and friction-reducing properties of the multi-arc ion plating CrN coating are improved by a low-temperature thermal cycle treatment method in a high humidity environment.

In the low-temperature thermal cycle treatment, the temperature cycle range is preferably −20 to 60° C., the heating rate is 2° C./min, the cooling rate is 1° C./min, and the temperature deviation is less than or equal to ±2° C./min.

The humidity is preferably maintained at 60%-80% R.H, and the humidity deviation is less than or equal to ±2% R.H.

The time of a single thermal cycle is 2 h, every 6 cycles is a period, the constant temperature is maintained for 12 h between every two periods, and the constant temperature fluctuation is ±0.5° C.

Compared with the prior art, the present invention adopts the combination of heat treatment technology and multi-arc ion plating technology, so that the prepared CrN coating has dislocation pile-up at the grain boundary of the material, thereby strengthening the internal stress at the grain boundary, and thus producing strain hardening effect to improve the strength of the CrN coating and to significantly improve the stability and service life of the coating. In addition, due to the 60%-80% RH humidity environment during the treatment process, there will be a large amount of O element (in the form of Cr oxides, oxygen atoms and oxygen ions) on the surface and inside the coating, which will continue participating in tribochemical reaction in the friction and wear process to generate Cr oxides. These oxides can be used as lubricant, so that the coating is improved in terms of wear reduction, wear resistance and the like. Therefore, it has good application prospects in the contemporary machinery industry.

The present invention will be further described below in conjunction with specific examples. It should be understood that these examples are only used to illustrate the present invention and not to limit the scope of the present invention. The experimental methods without specific conditions in the following examples generally follow the conventional conditions or the conditions recommended by the manufacturer. Unless stated otherwise, percentages and parts are percentages by weight and parts by weight.

Unless otherwise defined, all professional and scientific terms used herein have the same meaning as those familiar to the skilled in the art. In addition, any methods and materials similar to or equivalent to those described can be applied to the method of the present invention. The preferred implementation methods and materials described herein are for demonstration purposes only.

Example 1

In this example, a transitional Cr layer and a CrN coating (2 h deposition) were plated on the 316L stainless steel substrate using an arc ion plating technique. The target material used was a metal Cr target, and the vacuum degree of the reaction chamber base was $3 \times 10^{-3}$ Pa to $6 \times 10^{-3}$ Pa. Firstly, the surface of the substrate was etched to remove the oxide layer and impurities under the deposition biases of −900 V, −1100 V and −1200 V, respectively. For depositing transitional Cr layer, the working atmosphere was Ar, the flow rate was 350-450 sccm, the working vacuum was 0.2-0.5 Pa; the deposition bias was adjustable from −15 to −25 V, the Cr target arc current was 55-65 A, the deposition temperature was maintained at 300 to 400° C., and the deposition time was 10 to 15 minutes. Finally, CrN layer was deposited for 2 h, the working atmosphere was $N_2$, the flow rate was 550 to 650 sccm, the working vacuum degree was 0.2 to 0.5 Pa; the deposition bias was adjustable from −15 to −25 V, the Cr target arc current was 55-65 A, and the deposition temperature was kept at 300-400° C.

Then low-temperature thermal cycle treatment was carried out. The specific implementation parameters were as follows: the temperature cycle range was preferably −20 to 60° C., the heating rate was 2° C./min, the cooling rate was 1° C./min, the temperature deviation was less than or equal to ±2° C., the humidity was preferably maintained at 80% R.H., the humidity deviation was less than or equal to ±2% RH, single thermal cycle time was 2 h, 6 cycles per day, then the temperature was kept for 12 h and the constant temperature fluctuation was ±0.5° C.

The transmission electron microscope image and Fourier filter diagram of the CrN coating before and after 7 days of thermal cycle treatment are shown in FIG. 1. It can be seen that the columnar crystal structure inside the coating grows well before the low temperature thermal cycle treatment. After the low temperature thermal cycle treatment, many tiny cracks appear at the end of the columnar crystal and between the columnar crystals inside the coating. It can also be seen from the high-resolution transmission electron microscope image and the Fourier filter image that after a low-temperature thermal cycle, many lattice distortions and dislocation pile-ups appear at the grain boundaries of the coating. These phenomena are caused by the greater internal stress of the coating produced during thermal cycling. The dislocation pile-up also strengthens the internal stress at the grain boundaries, resulting in strain hardening.

Figure 2:
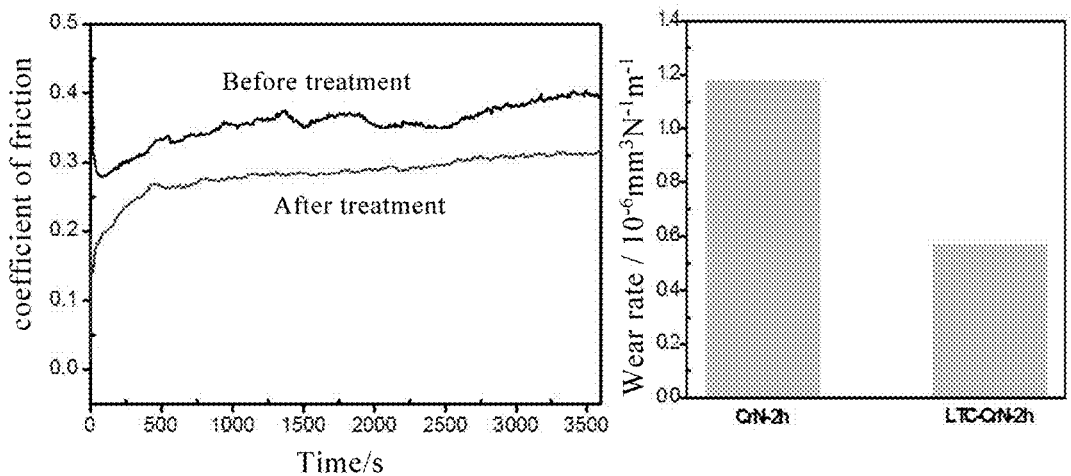
FIG. 2 is a comparison chart of friction coefficient and wear rate of CrN coating (with a thickness of 5.4 μm) before and after thermal cycle treatment in Example 1.

The mechanical property of the CrN coating after 7 days of thermal cycle treatment and the friction and wear properties under atmospheric environment (load: 10 N; frequency: 5 Hz) were tested. The hardness of the CrN coating (deposited for 2 hours) (with a thickness of 5.4 μm) was increased by 15%, friction coefficient was decreased by 31.8%, and the wear rate was decreased by 51.6% (as shown in FIG. 2). The anti-wear and friction-reducing properties of the coating were significantly improved.

Example 2

In this example, the same multi-arc ion plating technology deposition parameters as those in Example 1 were used, a 316L stainless steel substrate was plated with CrN coating (deposited for 12 hours), and then subjected to low-temperature thermal cycle treatment. The treatment parameters were the same as those in Example 1, except the humidity was kept at 60%.

Figure 3:
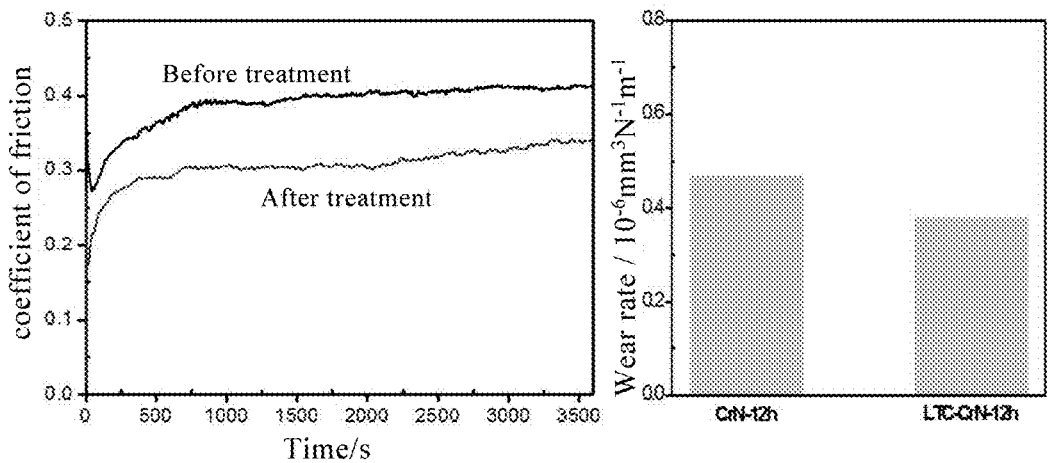
FIG. 3 is a comparison chart of friction coefficient and wear rate of the CrN coating (with a thickness of 41.5 μm) before and after thermal cycle treatment in Example 2.

The friction and wear properties of the CrN coating (12 h deposition) (with a thickness of 41.5 μm) after 7 days of thermal cycle treatment were tested under atmospheric environment (load: 10N; frequency: 5 Hz). The friction coefficient was decreased by 27.3%, and the average wear rate was decreased by 19% (as shown in the FIG. 3). The anti-wear and friction-reducing properties of the coating were significantly improved.

Example 3

In this example, the same multi-arc ion plating technology deposition parameters as those in Example 1 were used, a 316L stainless steel substrate was plated with CrN coating (deposited for 24 hours), and then subjected to low-temperature thermal cycle treatment. The treatment parameters were the same as those in Example 1, except the humidity was kept at 70%.

Figure 4:
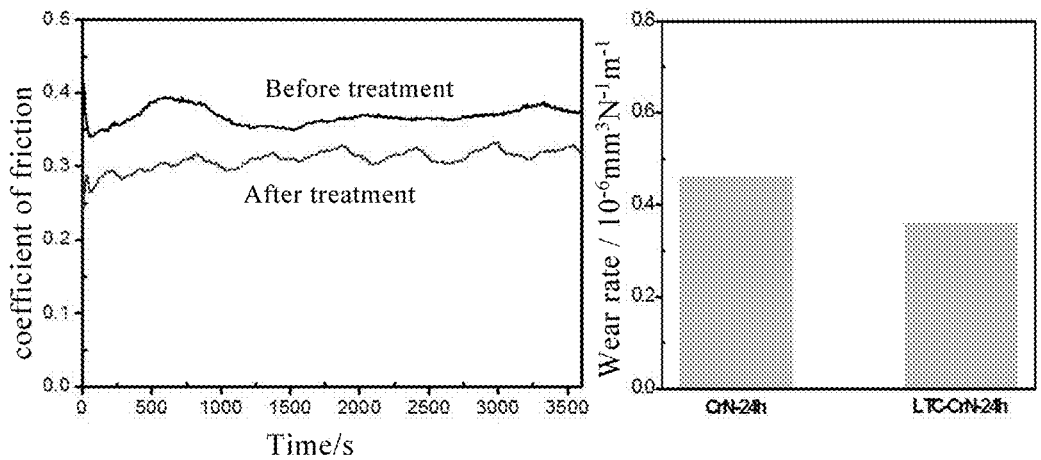
FIG. 4 is a comparison chart of friction coefficient and wear rate of CrN coating (with a thickness of 80.6 μm) before and after thermal cycle treatment in Example 3.

The friction and wear properties of the CrN coating (24 h deposition) (with a thickness of 80.6 μm) after 7 days of thermal cycle treatment were tested under atmospheric environment (load: ION; frequency: 5 Hz). The friction coefficient was decreased by 17.7%, and the average wear rate was decreased by 21.7% (as shown in the FIG. 4). The anti-wear and friction-reducing properties of the coating were significantly improved.

All documents mentioned in the present invention are cited as references in this application, just as each document is individually cited as a reference. In addition, it should be understood that after reading the above teaching content of the present invention, those skilled in the art can make various changes or modifications to the present invention, and these equivalent forms also fall within the scope defined by the appended claims of the present application.

The invention claimed is:

1. A post-processing method for CrN coating, which comprises: performing a thermal cycle treatment on the CrN coating in a temperature range of −20° C. to 60° C. under a humidity environment of 60% to 80% R.H,
   wherein, in the thermal cycle treatment, a single thermal cycle comprises a heating process from −20° C. to 60° C. and a cooling process from 60° C. to −20° C., a single thermal cycle time is 2 h, every 6 single thermal cycles is one period, a constant temperature is maintained between every two periods for 12 h, and the constant temperature has a fluctuation of ±0.5° C.,
   in the heating process, a heating rate is 2° C/min and a temperature deviation is less than or equal to ±2° C; and
   in the cooling process, a cooling rate is 1° C/min and a temperature deviation is less than or equal to ±2° C.

2. The post-processing method of claim 1, wherein the humidity has a deviation of less than or equal to ±2% R.H.

3. The post-processing method of claim 1, wherein the time of the thermal cycle treatment is 7 days.

4. The post-processing method of claim 1, wherein the thickness of the CrN coating is from 2 μm to 80 μm, and the thickness deviation is less than or equal to 0.5 μm.

5. The post-processing method of claim 1, wherein the CrN coating is plated on a substrate by a multi-arc ion plating technique, and the substrate is a metal or an alloy.

6. The post-processing method of claim 5, wherein the substrate is a 316 L stainless steel substrate.

7. The post-processing method of claim 5, wherein the CrN coating is plated on the substrate by multi-arc ion plating technology for 2 h to 24 h and then subjected to the thermal cycle treatment in the temperature range of −20° C. to 60° C., wherein the temperature deviation is less than or equal to ±2° C.

8. The post-processing method of claim 6, wherein the CrN coating is plated on the 316L stainless steel substrate by multi-arc ion plating technology for 2 h to 24 h and then subjected to the thermal cycle treatment in the temperature range of −20° C. to 60° C., wherein the temperature deviation is less than or equal to ±2° C.

* * * * *